(12) United States Patent
Kern et al.

(10) Patent No.: US 7,646,647 B2
(45) Date of Patent: Jan. 12, 2010

(54) MEASURING CIRCUIT AND READING METHOD FOR MEMORY CELLS

(75) Inventors: Thomas Kern, Munich (DE); Thomas Mikolajick, Dresden (DE); Jan-Malte Schley, Munich (DE)

(73) Assignees: Qimonda AG, Munich (DE); Qimonda Flash GmbH & Co. KG, Dresden (DE)

( * ) Notice: Subject to any disclaimer, the term of this patent is extended or adjusted under 35 U.S.C. 154(b) by 458 days.

(21) Appl. No.: 11/542,755

(22) Filed: Oct. 4, 2006

(65) Prior Publication Data

US 2007/0086240 A1    Apr. 19, 2007

(30) Foreign Application Priority Data

Oct. 4, 2005  (DE) ......................... 10 2005 047 407
May 11, 2006  (DE) ......................... 10 2006 022 072

(51) Int. Cl.
    *G11C 11/03* (2006.01)
(52) U.S. Cl. ..................... 365/185.28; 365/185.18; 365/191; 365/240
(58) Field of Classification Search ............ 365/185.28, 365/191, 240, 185.18
    See application file for complete search history.

(56) References Cited

U.S. PATENT DOCUMENTS

| | | | | |
|---|---|---|---|---|
| 5,255,226 A | * | 10/1993 | Ohno et al. ............ | 365/189.12 |
| 6,097,618 A | * | 8/2000 | Jenne ......................... | 365/63 |
| 7,184,305 B2 | * | 2/2007 | Tanno .................. | 365/185.09 |
| 2005/0135181 A1 | * | 6/2005 | Shionoiri et al. ....... | 365/230.06 |
| 2005/0195650 A1 | | 9/2005 | Deppe et al. | |

* cited by examiner

*Primary Examiner*—Pho M. Luu
(74) *Attorney, Agent, or Firm*—Slater & Matsil, L.L.P.

(57) ABSTRACT

An electronic circuit arrangement includes at least one memory element in which at least two electrical quantities can be stored. A switching unit is electrically connected to the memory element and has at least one first circuit path and a second circuit path. A storage unit has a first partial storage unit and a second partial storage unit. Each partial storage unit is set up for storing at least one electrical quantity. The switching unit is set up in such a way that it can sequentially pass a first one of the at least two electrical quantities along the first circuit path to the first partial storage unit and a second one of the at least two electrical quantities along the second circuit path to the second partial storage unit.

19 Claims, 11 Drawing Sheets

Fig 5

| | First operating mode 501 | Second operating mode 506 |
|---|---|---|
| First switch 424 | H | |
| First path 330 | L | |
| Second switch 423 | H | |
| | 502 | |
| | 503 | |
| First switch 426 | H | |
| | 504 | |
| Second path 340 | L | |
| Second switch 425 | H | |
| | 505 | |

500

MEASURING CIRCUIT AND READING METHOD FOR MEMORY CELLS

This application claims priority to German Patent Application 10 2005 047 407.1, which was filed Oct. 4, 2005, and to German Patent Application 10 2006 022 072.2, which was filed May 11, 2006, both of which applications are incorporated herein by reference.

TECHNICAL FIELD

The present invention relates generally to memories, and in one embodiment, to a measuring circuit and reading method for memory cells.

BACKGROUND

In the case of electrically writeable and erasable memories, a distinction is made between volatile and non-volatile memory cells. Non-volatile memory cells include, by way of example, a so-called charge trapping memory cell, which may be used in a virtual ground NOR architecture and the construction of which is modified on the basis of a MOS field effect transistor (MOSFET), to the effect that a gate insulation layer has, for example, a layer stack having three layers. Typically an electrically non-conductive middle layer of the three layers is provided for trapping and storing charge carriers and the outer boundary layers prevent the charge carriers from flowing away from the middle layer, which is also referred to as the storage layer.

By means of suitable programming operating modes, in the case of the memory cell charge carriers can be introduced into the storage layer in a defined manner in order to alter the electrical behavior of the memory cell in read operation. This programming of the memory cell results in different charge states of the memory cell, which can be assigned equivalently to different logic states and can also be read out again in suitable read operation of the memory cell.

When a voltage is applied between the control gate and the substrate in read operation of the memory cell, the presence of charges in the storage layer alters the vertical electric field in the channel region in comparison with the state of the memory cell in which no charges are present in the storage layer. The vertical electric field in the channel region that results from the applied voltage and the electric field of the charge carriers in the case of an electrically charged storage layer alters the operating behavior of the memory cell in comparison with the operating behavior in the case of an uncharged storage layer. This is shown, e.g., by the fact that the threshold voltage $V_T$ of the transfer characteristic curve of this modified MOSFET arrangement is shifted to higher values when negative charge carriers are introduced. Correspondingly lower threshold voltages result when positive charge carriers are introduced.

A memory cell constructed in this way is also referred to as a SONOS memory cell (semiconductor-oxide-nitride-oxide semiconductor).

In the case of this memory cell, the boundary layers are usually embodied as oxide and the storage layer is usually embodied as nitride of the semiconductor material, usually silicon.

Alongside other methods, charge-trapping memory cells are programmed by means of so-called hot electrons (channel hot electrons, CHE) by introduction of electrons into the storage layer during programming, and can be erased, e.g., by means of so-called hot holes in that the negatively-charged electrons in the storage layer are compensated for by means of positively-charged holes.

A SONOS memory cell provided for a specific operating mode with a read voltage applied in the opposite sense to the programming operation (reverse read) and with a thickness of the boundary layers that is adapted to this operating mode is usually referred to as an NROM memory cell. The NROM memory cell is typically constructed symmetrically with regard to a first source/drain region and a second source/drain region. The NROM memory cell can be operated in at least two different operating modes in which at least two electrical quantities can be derived. These operating methods typically differ in the direction of the electrical voltages, which are applied to their source/drain regions during the reading and programming of the memory cell.

By means of these two operating modes it is possible to program the memory cell into four different charge states and thus to store two bits since, in the case of programming operation in the first operating direction, from the first source/drain region to the second source/drain region, the charges are stored in the storage layer in a second charge storage region in the vicinity of the second source/drain region and, in the case of symmetrically reversed operation in the second operating direction, that is to say from the second source/drain region to the first source/drain region, charges are stored in the storage layer in the first charge storage region in the vicinity of the first source/drain region. During reading, the memory cell can be operated in such a way that the derived electrical quantities react particularly sensitively to charges present in one of the two charge storage regions or, respectively, of the charge storage layer and it is thus possible to define, e.g., four different logic states for storing two bits.

However, the introduction of charges into the first charge storage region, e.g., in the vicinity of the first source/drain region of such a memory cell causes alterations when reading out the electrical quantity during the operation of the memory cell in the second operating direction for detecting the amount of charge in the second charge storage region in the vicinity of the second source/drain region of the memory cell, and correspondingly vice versa.

This so-called crosstalk has a more pronounced effect, the greater the difference between the amounts of charge in the storage layer in the vicinity of the two source/drain regions. This crosstalk is reduced by means of suitable operating parameters such as, e.g., a higher voltage between the source/drain regions. However, as the technology is developed further, the effective channel length becomes smaller and, consequently, so does the physical distance between the charges on the two sides of a cell. This leads to greater crosstalk. It can, therefore, be expected that this crosstalk will cause problems during operation (in particular during read-out) to an increased extent in the future.

As described in U.S. Patent Publication No. 2005/0195650 A1, this crosstalk can be prevented, or greatly reduced, by means of altered operation of the memory cell.

In the case of this differential memory concept, greatly different amounts of charge at the two storage locations are avoided by virtue of the fact that the charge states are no longer directly assigned to the logic states, because the above-mentioned large differences in the amounts of charge between the two storage locations can arise with direct assignment.

In order to avoid this, the differential memory concept involves defining, e.g., two charge amount ranges that are small compared with the total charge amount range available for the programming of the memory cell. The charge states in the two charge storage regions are then either in an upper charge amount range, which is produced, e.g., by means of the difference between two upper charge states and, or in a lower charge amount range, which is produced e.g. by means of the difference between two lower charge states.

The two further logic states are then produced by means of programming in such a way that the charge states of the two charge storage regions differ in terms of magnitude by means of a value within one of the two defined charge amount ranges. The two further logic states are then produced by means of the sign of the difference when operating the memory cell in two different operating modes, e.g., by means of the channel region being operated in a first direction and by means of the channel region being operated in a second direction.

The effect of crosstalk is minimized with this programming by virtue of the fact that there are never large differences in the amounts of charge of the two charge storage regions or resulting threshold voltage differences during operation in the two operating modes. The threshold voltage of the memory cell serves as one example of an electrical quantity to be determined, which results from the charge states.

For determining the charge states of the memory cells, the at least two electrical quantities that result from the charge states in the at least two different operating modes of the memory cells are sequentially determined and provided since, in the case of the differential memory concept, at least one of the states results from the difference between the electrical quantities.

A circuit arrangement and a method for determining and providing electrical quantities according to a memory-operating concept with varying modes of operation are required.

SUMMARY OF THE INVENTION

An electronic circuit arrangement is specified, having at least one memory cell in which at least two electrical quantities can be stored. A switching unit is electrically connected to the memory cell. The switching unit has at least one first circuit path and a second circuit path. The circuit paths have at least one storage unit having a first partial storage unit and at least one second partial storage unit, each partial storage unit being set up for storing at least one electrical quantity. The switching unit is set up in such a way that it can sequentially pass a first one of the at least two electrical quantities along the first circuit path to the first partial storage unit and a second one of the at least two electrical quantities along the second circuit path to the second partial storage unit.

A method for reading and storing at least two electrical quantities of at least one non-volatile memory element is provided.

In this case, in a first one of at least two operating modes of the at least one memory element, the first one of the at least two electrical quantities is fed via a selection element to a first one of at least two partial circuit paths and is stored by means of a first one of at least two partial storage units. In a second operating mode of the at least one memory element, the second one of the at least two electrical quantities is fed via a selection element to a second partial circuit path and is stored by means of a second one of at least two partial storage units.

An electronic circuit arrangement is specified having at least one first means for storing at least two electrical quantities, having a switching means that is electrically connected to the storage means and that has at least one first circuit path and a second circuit path and that has a second storage means and at least one third means for storing in each case at least one electrical quantity.

The switching means is set up in such a way that it can sequentially pass a first one of the at least two electrical quantities along the first circuit path to the second storage means and a second one of the at least two electrical quantities along the second circuit path to the third storage means.

A computer program product for reading and storing at least two electrical quantities of at least one non-volatile memory element is specified, which, when it is executed by a processor, in a first one of at least two operating modes of the at least one memory element, feeds the first one of the at least two electrical quantities via a selection element to a first one of at least two partial circuit paths and stores it by means of a first one of at least two partial storage units. In a second operating mode of the at least one memory element, the computer program product executed by a processor feeds the second one of the at least two electrical quantities via a selection element to a second partial circuit path and stores it by means of a second one of at least two partial storage units.

BRIEF DESCRIPTION OF THE DRAWINGS

Exemplary embodiments of the invention are illustrated in the figures and are explained in more detail below.

FIG. 5 shows a drive sequence of an electrical circuit arrangement with drain-side sensing according to a first embodiment of the invention;

DETAILED DESCRIPTION OF ILLUSTRATIVE EMBODIMENTS

Figure 1:
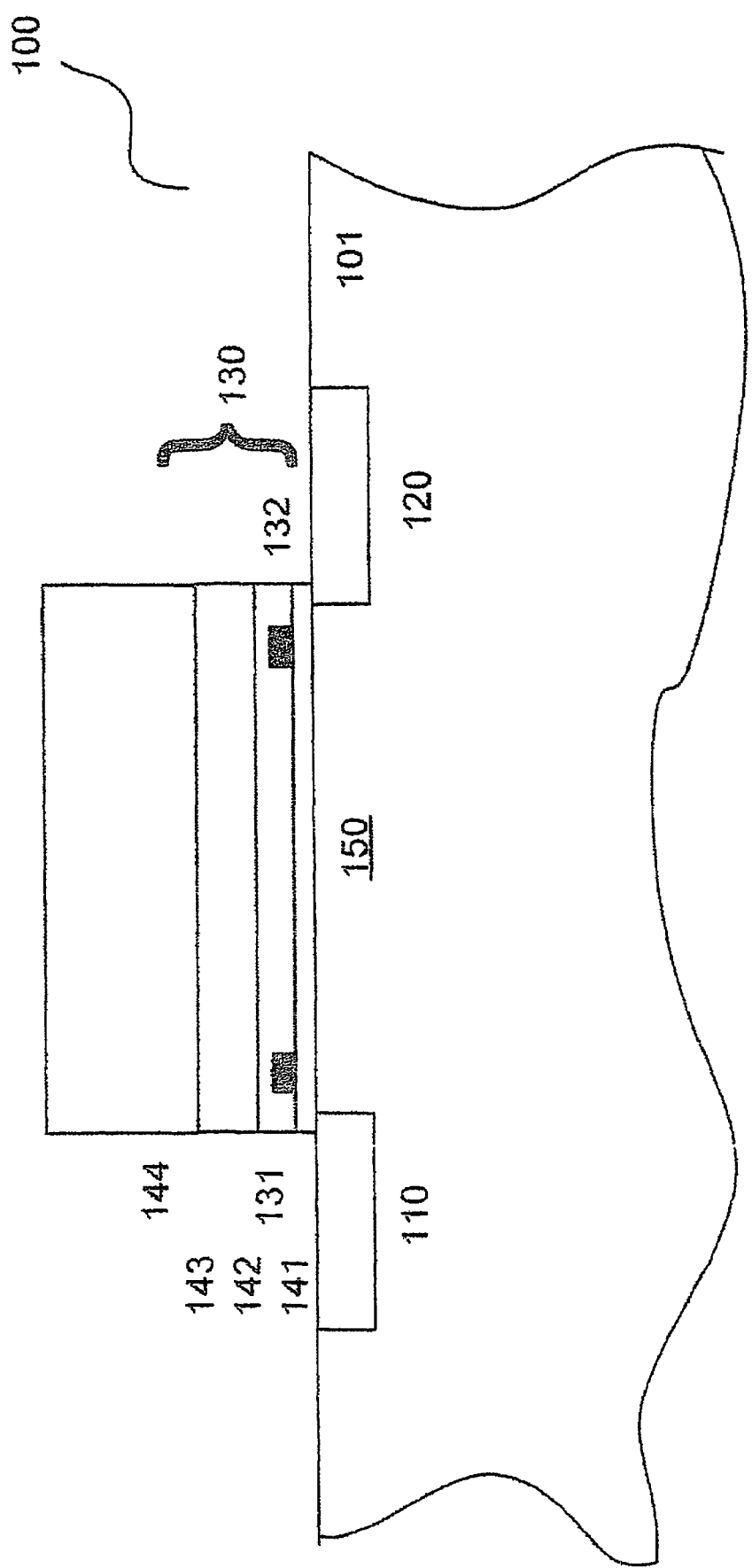
FIG. 1 shows an illustration of an example of the construction of an NROM memory cell.

As used herein the terms connected and coupled are intended to include both direct and indirect connection and coupling, respectively. The memory element can be a non-volatile memory cell. In the case of a non-volatile memory element, the content is preserved even if the voltage for operation, that is to say reading from and writing to the memory element, is switched off. Examples of such memory elements are SONOS memory elements, in which the silicon nitride layer can store charge carriers and thus influences the control behavior of a modified field effect transistor. In this case, the SONOS memory elements may be set up in such a way that they can be operated in two directions. Such memory elements are also referred to as NROM memory elements. Alongside the configuration in planar form there are further configurations of SONOS memory elements that can be operated in two directions, such as, by way of example U-shaped memory elements and fin-type memory elements.

In the case of floating gate memory elements, as a further example of such non-volatile memory elements, the charges are stored in a conductive layer (e.g., polysilicon) arranged in insulated fashion, in order to influence the control behavior of a modified field effect transistor. If the conductive layer arranged in insulated fashion for storing the charge carriers is divided into two conductive regions that are electrically insulated from one another, so that a first region is arranged above the channel region in the vicinity of the source and the second region is arranged in the vicinity of the drain, it is possible according to the NROM cell, to store and read out charge carriers either in the first region or in the second region by means of two different operating modes of such a modified floating gate cell (split gate).

A conductive bridging RAM (CBRAM) in which the information is stored by the presence of a conductive bridge having silver clusters may also be used as a non-volatile memory cell.

In the case of a ferroelectric RAM (FeRAM), the information is stored in a non-volatile manner by using the remanent polarization of a ferroelectric layer, which influences the magnitude of a capacitance.

Furthermore, as an example of non-volatile memories, mention may be made of the magnetoresistive RAM (MRAM), in which the varying orientation of the magnetization vector leads to an alteration of the resistance in order to store the information.

In accordance with a further example of non-volatile memories, in the case of an organic RAM (ORAM), the change in the resistance of a suitable material by the application of positive or negative voltages is used for the non-volatile storage of information.

In the case of a phase change RAM (PCRAM), the non-volatile storage is realized by thermally induced change in resistance during the reversible phase transition.

In various configurations of the invention it is assumed that the non-volatile memory elements described above are set up or driven in such a way that they can be operated in two different operating modes for storing more than one bit per cell in order to be able to be operated advantageously with the electronic circuit arrangement described below.

By virtue of the symmetrical construction of a SONOS memory cell corresponding to an NROM memory cell, such a SONOS cell can be operated in two different directions and two different operating modes are thus available, permitting storage of at least two bits per memory cell.

In accordance with one configuration of the invention, the at least one memory element is set up in such a way that the electrical quantities that can be provided during operation of memory elements may represent different charge states.

In accordance with one configuration of the invention, the electronic circuit arrangement has a switching unit with at least one selection element, which can feed the electrical quantity, according to the switching state of the selection element, for the at least one partial storage unit, and at least one control unit, which can predetermine the switching state of the selection element.

If the items of information have been read out from such a non-volatile memory cell in the form of electrical quantities sequentially in two different operating modes, they may be stored for the further processing of the information in a memory element of a partial storage unit which is configured, e.g., in the form of at least one capacitor. Further possibilities for storing the electrical quantities that are read out may be implemented both with volatile memory elements such as, e.g., DRAMs and with circuit arrangements such as flip-flops, registers and latches, by way of example.

In the case of the multibit memory scheme described, the intention is to determine or detect the sum of and the difference between the two memory cell currents from each side of the multibit cell. The information is stored in each case after detection during the operation of the memory element in the first direction and second direction, respectively. The current information is intended to be stored for further processing. This corresponds to a sample-and-hold mechanism. In the implementation of the circuit arrangement, the information can be held by the use of a capacitance as memory element. The voltage at the two different capacitances can then be used for the further processing.

In the electronic circuit arrangement, the at least one selection element may have at least one transmission gate.

In accordance with one configuration of the invention, the electronic circuit arrangement is set up with a control unit such that the at least one selection element can first couple the first one of the at least two electrical quantities of the memory element to the first one of the at least two partial storage units and can then couple a second one of the at least two electrical quantities to a second one of the at least two partial storage units.

The electrical quantities read out from the non-volatile memory element can be conducted into different circuit paths by virtue of the switching state of at least one selection element feeding an electrical quantity via the selected circuit path to a partial storage unit. In this case, the switching state of the selection element is controlled by a control unit that controls the selection element synchronously with the operating phase of the memory element. A suitable arrangement of transmission gates or else a corresponding multiplexer circuit, by way of example, may be used as the selection element.

The electronic circuit arrangement may be connected up in such a way that the at least one electrical quantity can be stored in the at least one partial storage unit by means of at least one capacitor.

In accordance with another configuration of the invention, the control unit is set up such that the at least one selection element can first couple a first one of the at least two electrical quantities of the memory element to the first one of the at least two partial storage units and can then couple a second one of the at least two electrical quantities to a second one of the at least two partial storage units. In the case of this coupling, the electrical state of the memory element alters the electrical state of the partial storage unit since the selection element produces a connection of the memory element in each case to at least one of the circuit paths with at least one partial storage unit.

The electronic circuit arrangement may be set up with a control unit such that first a first electrical quantity can be provided by means of operating a memory element in a first manner and then the second electrical quantity can be provided by means of operating the memory element in a second manner.

A method for reading and storing at least two electrical quantities of at least one memory element is furthermore provided, in which case in a first one of at least two operating modes of the at least one memory element, the first one of the at least two electrical quantities is fed via a selection element to a first one of at least two partial circuit paths and is stored by means of a first one of at least two partial storage units.

In a second operating mode of the at least one memory element, the second one of the at least two electrical quantities is fed via a selection element to a second partial circuit path and is stored by means of a second one of at least two partial storage units. At least one non-volatile memory element may be used for this memory element. Specifically, at least one SONOS memory element may be used as the memory element. The change in the state of the partial storage unit can be achieved by means of charging a capacitor. As an alternative, the change in the state of the partial storage unit may be achieved by means of discharging a capacitor.

The operation of the SONOS memory element may be embodied such that, in a first operating mode, the current flows from a first terminal of the memory element to the second terminal of the memory element and, in a second operating mode, the current flows from a second terminal of the memory element to the first terminal of the memory element.

The SONOS memory element may be operated such that, in a first operating mode, a voltage is applied with a magnitude such that primarily the first charge accumulation as seen in the current direction over the channel region of the memory element has the main influence on the defined electrical quantity and, in a second operating mode, a second voltage is applied with a magnitude such that both charge accumulations over the channel region of the memory element exert a significant influence on the definition of the electrical quantity.

In each operating mode of the memory element, precisely one circuit may be assigned to one path.

FIG. 1 shows a basic construction of an NROM memory cell 100 in accordance with one exemplary embodiment of the invention. A first source/drain region 110 and a second source/drain region 120 are arranged at a distance from one another on a substrate 101, the channel region 150 extending between the source/drain regions in the substrate 101. Above the channel region 150, a gate structure 130 is formed in the substrate 101, for example, made of silicon. The source/drain regions 110 and 120 and the gate structure 130 are typically connected to further circuit elements by means of electrical contacts.

The gate structure 130 has three layers, a first silicon oxide layer 141, a silicon nitride layer 142 and a second silicon oxide layer 143 in the layer sequence in accordance with this exemplary embodiment. The electrical word line contact for the application of the gate voltage to the gate structure 130 is typically achieved by means of a planar gate contact 144. The source/drain regions 110 and 120 are typically electrically connected to the bit lines of the memory arrangement.

The gate contact 144 is electrically insulated from the channel region 150 in the substrate 101 by means of the gate structure 130. Charges can be stored within the storage layer 142 of the gate structure 130. Typically, the first charge storage region 131 is situated in the vicinity of the first source/drain region 110 within the storage layer 142 and the second charge storage region 132 is situated in the vicinity of the second source/drain region 120 within the storage layer 142. In this case, the respective location of the charge storage regions 131 and 132 in the vicinity of the first source/drain region 110 and in the vicinity of the second source/drain region 120, respectively, is determined according to the operating conditions of the memory cell 100.

The location of the charge storage regions 131 and 132 is primarily determined by virtue of the fact that the electrons in the horizontal field in the channel region 150 must have taken up, by means of a voltage between the two source/drain regions 110 and 120, so much energy that they can surmount the potential barrier of the insulating layer at this site by means of scattering with other electrons and can penetrate into the storage layer 142.

The storage layer 142 of a charge-trapping memory cell 100 is situated between boundary layers 141 and 143 made of a material having a higher energy band gap than the energy band gap of the storage layer, so that the charge carriers trapped in the storage layer 142 remain localized there.

The difference in the energy band gaps is significant, and this can be achieved by means of varying the materials of the storage layer 142 and also by means of varying the boundary layers 141 and 143, in which case the difference between the energy band gaps is intended to be as large as possible for good electrical confinement of the charge carriers.

Suitable materials for the storage layer of the memory cell 100 are typically nitrides, and an oxide is typically used as a boundary layer. The NROM memory cell already described is an example of an oxide-nitride-oxide (ONO) storage layer sequence in the material system of silicon. In this case, the silicon nitride storage layer typically has an energy band gap of approximately 5 eV and the surrounding boundary layers are silicon oxide having an energy band gap of approximately 9 eV.

In conjunction with silicon oxide as a boundary layer, it is possible, e.g., as an alternative to use tantalum oxide, hafnium silicate, titanium oxide ($TiO_2$ in the case of stoichiometric composition), zirconium oxide ($ZrO_2$ in the case of stoichiometric composition), aluminium oxide ($Al_2O_3$ in the case of stoichiometric composition) or intrinsically conducting (undoped) silicon as material of the storage layer.

The first bit of such a two-bit NROM memory cell 100 is programmed in such a way that a vertical electric field is generated by means of a gate voltage. In the first operating direction, by means of the application of a voltage between the first source/drain region 110 and the second source/drain region 120, in the channel region 150 of the memory cell 100, a lateral electric field is additionally generated in a first operating direction, which electric field accelerates the electrons along the channel length.

In this case, some electrons are accelerated by means of scattering such that, in the channel region 150 in the vicinity of the second source/drain region 120, where the lateral electric field is strongest, they jump over the potential barrier and reach the charge storage layer 142 and define the second charge storage region 132.

By means of such a charge accumulation in the charge storage layer 142, the threshold voltage of the memory cell 100 changes, which can typically be ascertained by means of applying a read voltage in an opposite direction to the first operating direction. The second bit in this memory cell 100 is typically programmed by applying an opposite voltage to the first operating direction between the second source/drain region 120 and the first source/drain region 110.

In this case, the electrons in the vicinity of the first source/drain region 110 will pass over the potential barrier into the first charge storage region 131 of the charge storage layer 142. By means of the presence or absence of negative charges in the charge storage regions 131 and 132 respectively, it is possible in a non-volatile memory cell 100, such as an NROM cell for example, to store an information item of two bits in geometrically separated charge storage regions.

When reading out the states, in this operating mode, the charge state is detected in each case by means of a read voltage applied in the opposite direction to the programming operation (reverse read) between the respective source/drain regions 110 and 120.

The predominantly symmetrical construction of this memory cell 100 enables operation in a first operating direction from the first source/drain region 110 to the second source/drain region 120, and also correspondingly reversed operation form the second source/drain region 120 to the first source/drain region 110.

These operating directions are used both for programming and for reading. If operation in the first direction is effected during programming, for example, this charge state, which is presently stored in the second charge storage region 132, is read out by the memory cell 100 being operated in the opposite direction, so that the second charge storage region 132 is principally crucial for the resulting electrical quantity. The first charge state in the vicinity of the first source/drain region 110 in the first charge storage region 131 is programmed and read in the case of a correspondingly respectively reversed operating mode.

These two operating modes make it possible to store at least four different electrical states and thus at least two bits since charge carriers can be stored in the two charge storage regions 131 and 132 or can be compensated for by means of the correspondingly oppositely charged charge carriers.

The stored information is detected, e.g., by determining the threshold voltage of the memory cell transistor $V_T$ as a possible electrical quantity that defines the charge state of the memory element.

Crosstalk, in the case of which charges, e.g., in the second charge storage region 132 influence the electrical quantity during the read-out of the first charge storage region 131, may have an effect as follows. For the purpose of reading the NROM memory cell 100, a specific control gate voltage is applied between the control gate 144 and the first source/drain region 110. In addition, a positive voltage is applied between the first source/drain region 110 and the second source/drain region 120.

In the case of this voltage direction, the amount of charge in the storage layer in the vicinity of the first source/drain region 110 is then detected since, in the case of this operating direction, the inversion layer charge in the channel region 150 in the vicinity of the first source/drain region 110 is greater than the inversion layer charge in the channel region in the vicinity of the second source/drain region 120.

If, by way of example, a negative charge is stored in the nitride layer in the first charge storage region 131 in the vicinity of the first source/drain region 110, then it impedes, for a positively doped channel 150, the formation of a conductive channel between the first source/drain region 110 and the second source/drain region 120 and a significantly lower current flows at this gate voltage than if there were no negative charge stored in the nitride layer 142 in the first charge storage region 131.

By way of example, there is no negative electrical charge present in the first charge storage region 131 in the vicinity of the first source/drain region 110, but negative electrical charges are present in the second charge storage region 132 in the vicinity of the second source/drain region 120 of the NROM cell 100, this may also have the effect that the threshold voltage of the transfer characteristic curve is altered during operation in the first operating direction of the NROM cell 100 such that, by way of example, no drain current flows at the specific gate voltage.

In order to reduce the effect of crosstalk, which is all the more pronounced, the greater the difference between the amounts of charge in the storage layer 142 in the two charge storage regions 131 and 132, the differential memory concept described in U.S. Patent Publication No. 2005/0195650 A1 was introduced, which publication is hereby incorporated by reference in its entirety in the description.

Different charge states of the memory cell 100 are achieved during the programming of the memory cell 100. In the case of the NROM memory cell 100 described, defined charge states can be programmed for both of the two charge storage regions 131, 132 and be read out again. The charge states can be set in equivalent fashion by means of suitable combination of different logic states and thus serve for storing binary information items. In this case, the amount of charges stored in the charge storage regions 131 and 132 can be chosen in a suitable manner and is to be chosen freely on an analog scale.

A plurality of ranges of a certain amount of charges is typically defined for the assignment to a charge state of the charge storage regions 131 and 132 in order thereby to perform a certain digitization of the programming and thus achieve a greater resistance to errors for the programming and reading under, e.g., altered operating conditions of the memory cells or production tolerances of the memory cells.

Accuracies during programming and reading and also during the production of the memory cells and the aging of the memory cells determine the width of the charge storage regions 131, 132.

Figure 2:
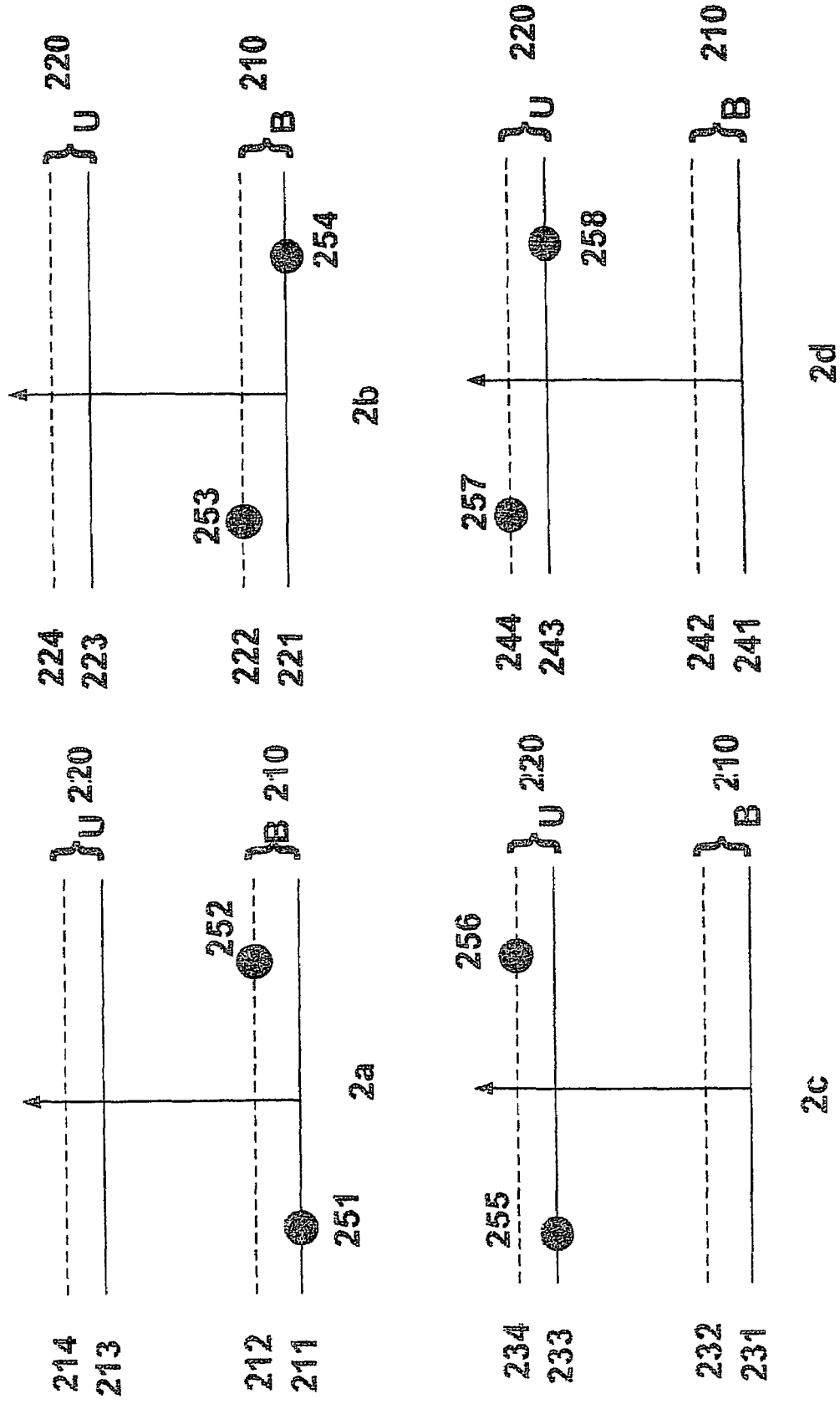
FIG. 2 shows an illustration of the charge states and charge state ranges for storing four states in the differential memory concept of a non-volatile memory cell.

FIG. 2a illustrates the different logic states for storing two bits in accordance with the differential memory concept, which is also referred to as the multibit memory scheme. The filled-in circles 251 to 258 each symbolize the value of the threshold voltage, resulting from the charge states of the first charge storage region 131 and of the second charge storage region 132, of a memory cell. In this case, the odd reference symbols 251, 253, 255 and 257 in each case denote the charge states of the first charge storage region 131 and the even reference symbols 252, 254, 256 and 258 denote the charge states of the second charge storage region 132.

The four charge states are distributed between two charge amount ranges 210 and 220. In this case the distance between the two charge amount ranges 210 and 220 is typically greater than the distance between the charge states within a charge amount range.

The distance between the two charge amount ranges 210 and 220 is chosen such that under practical conditions it is possible when reading the memory cell to reliably distinguish whether the charge state corresponding to a lower, first charge amount range 210 or a charge state corresponding to an upper, second charge amount range 220 has been programmed.

In the case of the first logic state illustrated in FIG. 2a, the charge state 251 of the first charge storage region 131 lies below the charge state 252 of the second charge storage region 132, in which case the logic state results when reading both by means of the sign of the threshold voltage difference upon comparison of read operation in the second direction in comparison with read operation in the first operating direction, and by means of the position of the threshold voltages in both read directions according to the lower, first charge amount range 210.

The second logic state illustrated in FIG. 2b then results in an analogous form with the opposite sign of the threshold voltage difference now resulting upon comparison of read operation in the second direction in comparison with read operation in the first operating direction. The difference between the charge states according to FIG. 2a and the charge states according to FIG. 2b are typically comparable in terms of magnitude, and only the mathematical sign of the difference between the two threshold voltages is crucial for the evaluation of the stored logic state. Since only the sign of the difference has to be detected in order to distinguish the logic states according to FIG. 2a and FIG. 2b, for reliable operation it is possible to choose the difference between the charge states within the charge amount range 210.

The third logic state illustrated in FIG. 2c and the fourth logic state illustrated in FIG. 2d result in a comparable manner to the first and second logic states, here the corresponding threshold voltages resulting in each case at the higher level according to the upper, second charge amount range 220. Here, too, the sign of the respective difference between the corresponding threshold voltages is crucial for the difference between the third logic state and the fourth logic state.

One advantage of the differential memory concept in accordance with FIG. 2a to FIG. 2d can be seen in the fact that in each case the difference between the first charge storage region 131 and the second charge storage region 132 of the memory cell is programmed and read, both threshold voltages lying within a small threshold voltage range. According to the small charge state differences in the two charge storage regions 131 and 132, relatively large threshold voltage differences between the two sides of the cell never occur, whereby crosstalk is reduced.

As an example of the differential memory concept, it is possible to specify the difference in the threshold voltages between the lower threshold voltage range, which corresponds to the lower, first charge amount range 210 and the higher threshold voltage range which corresponds to the upper, second charge amount range 220, as approximately 1.5 V and the threshold voltage difference within the charge amount range 210 respectively 220, that is to say between, e.g., the first charge state 251 and the second charge state 252 or respectively between, e.g., the third charge state 255 and the fourth charge state 256, as approximately 300 mV. However, other differences can also be realized.

Four charge states distributed between two charge amount ranges 210 and 220 have been described in the example above. Consequently, the memory cell is a two-bit memory cell. If one or more additional charge amount ranges are defined in addition to the first charge amount range 210 and second charge amount range 220, then additional bits can be programmed in a memory cell and read out in an analogous manner.

From the basic understanding of the operating concept according to the NROM memory cell 100, it is possible to define even further operating modes of the memory cell in order to read out programmed states.

If permitted by the accuracy of the measurement of the threshold voltage, it is possible to determine the read-out of the threshold voltage levels in the two operating directions even in the case of operation only in one direction. In this case, different voltages are applied between the first source/drain region and the second source/drain region in such a way that, by means of a significantly lower voltage of, e.g., 0.4 V, the crosstalk described is utilized to determine the average level of the threshold voltage and thus the charge amount range 210 or 220 and possibly further charge amount ranges.

By maintaining the same operating direction but applying a higher voltage, in order to reduce the crosstalk, the magnitude of the charge state of a relevant charge amount range such as, e.g., 210, 220 or of further charge amount ranges of the present operating direction is detected and can be used in the comparison with respect to the average level of the charge amount range in order to determine the sign of the level difference. Both the level of the threshold voltage and the sign of the threshold voltage difference have thus been determined. The threshold voltage serves here as an example of an electrical quantity that may result from the charge states of the memory cell depending on the operating concept. Other electrical quantities, such as, e.g., specific currents under defined operating conditions, may also be derived from the charge states.

An electronic circuit arrangement and a method for determining and providing electrical quantities of a memory element are explained below, in which case, with the aid of a control unit, the memory element is driven and operated in at least two different operating modes and the electrical quantities that are read out sequentially in this case are fed in synchronized fashion to at least two different partial circuit paths. The partial storage units connected to the circuit paths store the resulting electrical quantities and provide them for further processing.

Figure 3:
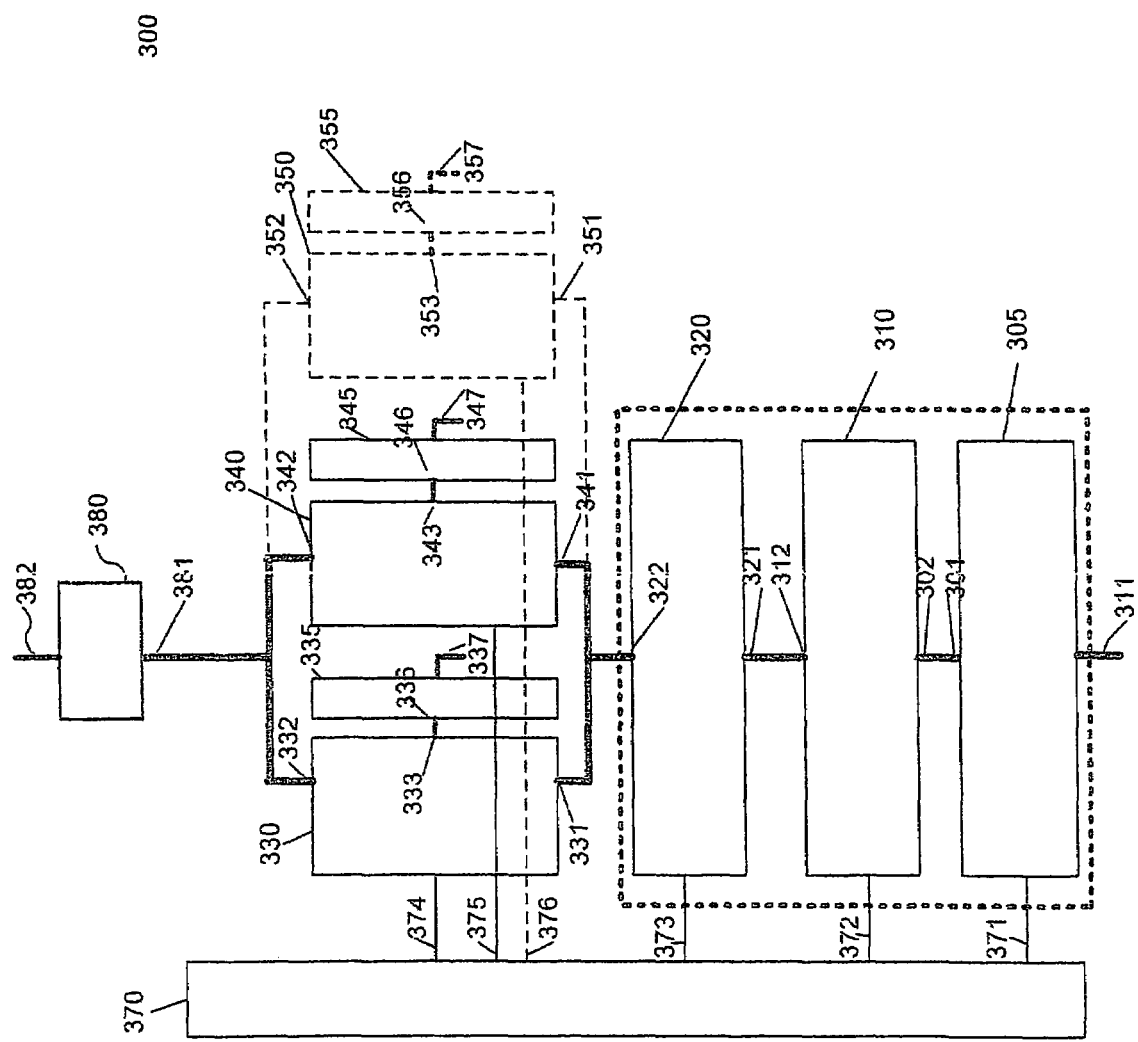
FIG. 3 shows a block diagram of the circuit arrangement.

FIG. 3 shows a block diagram of an electronic circuit arrangement 300 for determining and providing electrical quantities of the memory cells described above. The basic circuit of the circuit arrangement 300 shows a series circuit comprising a first decoder 305, a memory array 310, a second decoder 320, a plurality of partial circuit paths 330 and 340 connected in parallel, a current/voltage converter 380 and a control unit 370 connected in parallel, which is connected via its control lines 371 to, if appropriate, 376 both to the first decoder 305, to the memory array 310, to the second decoder 320 and to the partial circuit paths 330 and 340. The partial circuit paths 330 and 340 are respectively connected to the partial storage units 335 and 345.

An optional extension of the circuit with additional partial circuit paths is possible by means of an optional additional partial circuit path 350 correspondingly connected in parallel with the other partial circuit paths 330 and 340, with the connection to its additional partial storage unit 355 and the connection 376 to the control unit 370.

The first decoder 305 has a first connection 311 and a second connection 301. The first connection 311 of the series circuit at the first decoder 305 is typically connected to a lower electrical potential $V_1$ than a second connection 382 of the series circuit at the current/voltage converter 380, which is connected to a potential $V_2$.

The memory array 310 has a first connection 302 and a second connection 312. The second connection 301 of the first decoder 305 is connected to the first connection 302 at the memory array 310.

The second connection 312 of the memory array 310 is connected to a first connection 321 of the second decoder circuit 320, the second connection 322 of which is connected to a first connection 331 of a first partial circuit path 330 and to a first connection 341 of a second partial circuit path 340; the second connection 322 of the second decoder circuit 320 may furthermore be connected to a first connection 351 of optional additional partial circuit paths 350.

Each partial circuit path 330, 340 and if appropriate, each of the additional partial circuit paths 350 is connected by its respective third connection 333 and 343 and, if appropriate 353 to a first connection 336, 346 and if appropriate, 356 of the partial storage unit 335, 345, and, if appropriate, 355. A second connection 337, 347 and optionally 357 of the partial storage units 335, 345 and, if appropriate, 355 may in each case be connected to a lower or higher (for example in the case of source-side sensing) potential than the second connection 382 of the series circuit at the current/voltage converter 380. The second connections 332, 342 and, if appropriate, 352 of the partial circuit paths 330, 340 and optionally, 350 are connected to one another and connected to a first connection 381 of the current/voltage converter 380.

A second connection 382 of the current/voltage converter 380, which corresponds to the second connection of the series circuit, may be connected to a higher electrical potential $V_2$.

Leading from the control unit 370 are, by way of example, respectively at least one control line 371 to the first decoder 305, at least one control line 372 to the memory array 310, at least one control line 373 to the second decoder 320, at least one control line 374 to the first partial circuit path 330, at least one control line 375 to the second partial circuit path 340 and, if appropriate, control lines such as the control line 376 to optional additional partial circuit paths such as the optional additional partial circuit path 350.

The operation of the circuit arrangement 300 is explained in more detail below with reference to FIG. 3.

If, by means of the driving by the control unit 370 both of the first address decoder circuit 305, and of the memory array 310 and of the second address decoder circuit 320, a memory element in the memory array 310 is operated in a first manner, the first partial circuit 330 is switched by means of the control unit 370 such that the resulting electrical quantity changes the state of the first partial storage unit 335. The other partial circuit paths 340 and, if appropriate, 350 are switched by means of the control unit 370 such that the associated partial storage units 345, and, if appropriate, 355 remain unchanged.

If, in a further step, by means of the driving by the control unit 370 both of the first decoder circuit 305, and of the memory array 310 and of the second decoder circuit 320, a memory element in the memory array 310 is operated in a second manner, the second partial circuit 340 is switched by means of the control unit 370 such that the resulting electrical quantity changes the state of the second partial storage unit 345. The other partial circuit paths 330 and, if appropriate, 350 are switched by means of the control unit 370 such that the associated partial storage units 335, and, if appropriate, 355 remain unchanged.

By means of the state changes of the partial storage units 335 and 345, and, if appropriate, additional partial storage units such as 355, the electrical quantities are then ready to be processed further.

The current/voltage converter 380 can be used to suitably convert electrical quantities from the memory element from the memory array 310 for the partial storage units 335, 345 and, if appropriate, 355.

Figure 4:
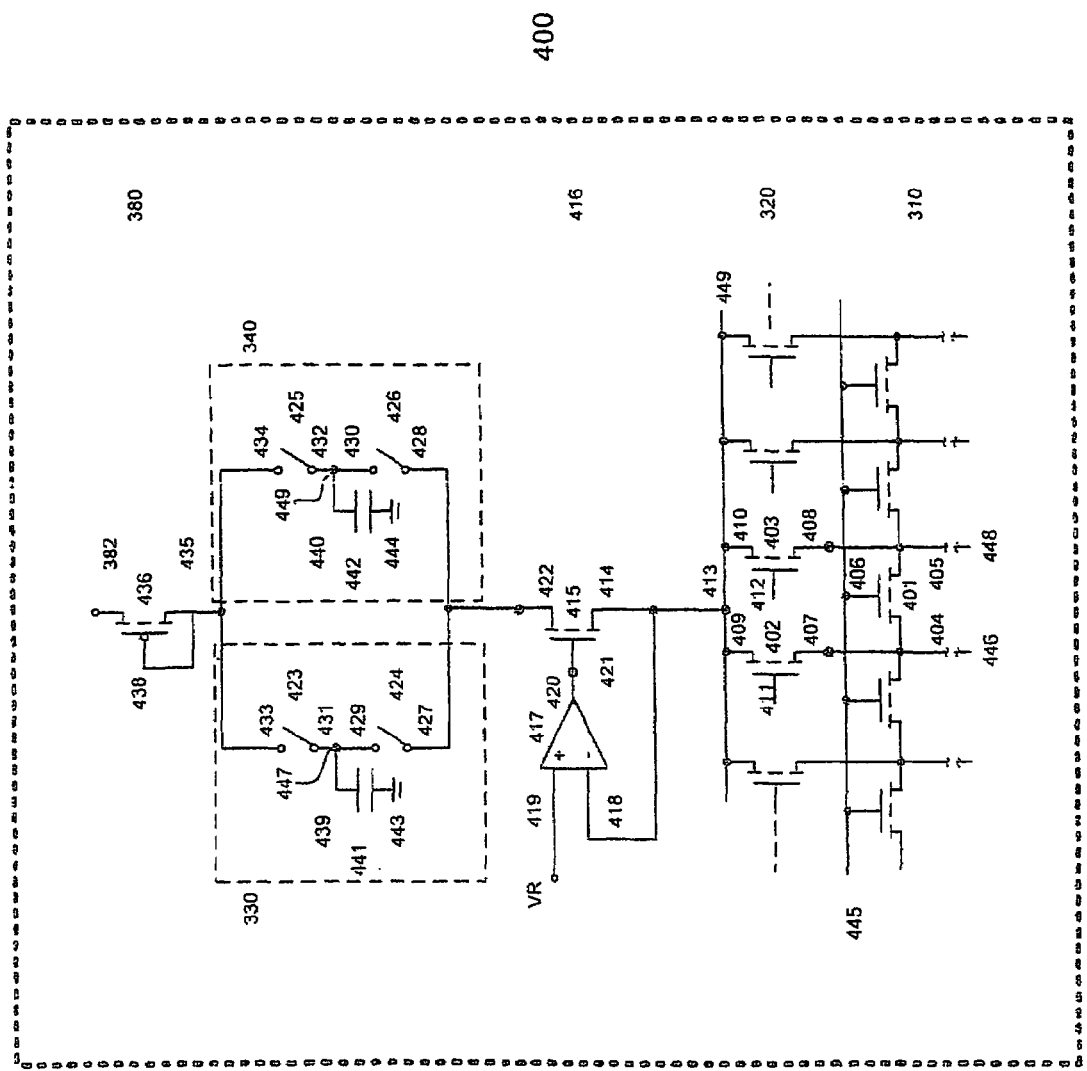
FIG. 4 shows an electrical circuit arrangement with drain-side sensing in accordance with a first embodiment of the invention.

FIG. 4 shows a detail realization with individual elements of the electronic circuit arrangement 300 from FIG. 3 in accordance with a first exemplary embodiment of the invention. In this case, a more detailed description of the first address decoder circuit is dispensed with for reasons of simple description of the invention. The decoder circuits are embodied in a single stage here for reasons of simpler description. The decoders may also be configured in multiple stages.

As illustrated in FIG. 4, a first variant 400 of the drain-side sensing measuring circuit arrangement 300 includes memory elements such as, e.g., 401 arranged in series one alongside another in the memory element array 310, from which memory elements, with the aid of the first decoder and selection transistors such as, e.g., 402 and 403 of the second decoder 320 and the control unit 370 connected to the memory array 310 and the second decoder 320, a memory element 401 can be selected and an electrical quantity of the memory element 401 can be fed to a partial circuit path such as, e.g., 330 or 340 monitored by the control unit 370.

According to FIG. 4, the measuring circuit arrangement 300 in accordance with a first embodiment 400 shows memory elements 401 arranged in series one alongside another and each having a first connection (first source/drain region) 404, a second connection (second source/drain region) 405 and a control connection (gate) 406, which are in each case electrically connected to the second connection 405 of the first memory element 401 at the first connection of the memory element arranged alongside it.

These memory elements 401 arranged one alongside another constitute an extract from the memory array 310, in which, in the "virtual ground" architecture of the memory element array 310, a plurality of such memory elements 401 arranged one alongside another may be present in a manner connected in parallel. However, the memory element array 310 may also be present in different memory element architectures than is set forth in this first exemplary embodiment.

The control connections 406 of the memory elements 401 arranged in a series one alongside another are in each case electrically connected to one another and can be connected to the control unit 370. The first connections such as 404 and the second connections 405 of the memory elements such as, e.g., 401 can be connected according to further circuitry interconnection to the ground potential or some other first potential. In this case, this first potential $V_1$ may be lower than a second potential $V_2$ provided at the second connection 382 of the current/voltage converter 380.

The memory elements such as, e.g., 401 of the memory element array 310 can be connected via the selection transistors 402 and 403 of the second decoder 320 to the partial circuit paths such as 330 and 340, respectively. The selection transistors 402 and 403 have a first connection 407 and 408, respectively, a second connection 409 and 410, respectively, and a third connection 411 and 412, respectively. The third connection 411 and 412 of the selection transistors 402 and 403, respectively, can be connected to the control unit 370.

The first connection 404 of the memory elements 401 is in each case connected to a first connection 407 of the first selection transistor 402. The second connection 405 of the memory elements 401 is in each case connected to a first connection 408 of the second selection transistor 403.

The respective second connections 409 and 410 of the selection transistors 402 and 403 of the second decoder 320 are in each case connected to one another, e.g., by means of a connecting line 449 and to an output node 413 of the second decoder 320 and are connected, moreover to the first connection (source) 414 of a regulating field effect transistor 415 of a potentiostat circuit 416. The potentiostat circuit 416 serves for keeping the potential of the memory elements 401 as far as possible constant during the read-out of the electrical quantity under varying operating conditions of the electronic circuit 300.

The first connection 414 of the potentiostat circuit 416, having the regulating FET 415 and an operational amplifier 417 is connected to the inverting input 418 of the operational amplifier 417. The non-inverting input 419 can be connected to a reference potential $V_R$. The output 420 of the operational amplifier 417 is connected to the control connection 421 (gate) of the regulating field effect transistor 415.

It is assumed in the description of the circuit that an N-type is used for the regulating FET. If a P-type regulating FET were used, the connections to the operational amplifier 417 would be interchanged. Instead of the operational amplifier 417, it is also possible to use a differential amplifier, which is not explained in any greater detail here for the sake of clarity.

The second connection 422 of the regulating field effect transistor 415, which is identical to the second connection 422 of the potentiostat circuit 416, is connected to the two electrical paths 330 and 340 respectively. In each of these electrical paths 330 and 340 respectively, two switches 423 and 424, and respectively 425 and 426, are connected to one another in series. That is to say, the respective first connection 427 and 428 of a first switch 424 and 426, respectively, in the respective path 330 and 340 is connected to the second connection 422 of the regulating field effect transistor 415.

The second connection 429 and 430 respectively of the first switch 424 and 426, respectively, in the respective path 330, 340 is connected to the first connection 431 and 432 respectively of a second switch 423 and 425, respectively. The switches 423, 424, 425 and 426 in the two paths 330 and 340 respectively can be switched by means of the control unit 370.

The two second connections 433 and 434 of the second switches 423 and 425, respectively, in the two paths 330, 340 are connected to one another. This connection is connected to a first connection 435 of a field effect transistor 436 connected as a diode, and a second connection 382 of this diode circuit can be connected to the voltage supply or a second potential $V_2$, which is typically higher than the first potential $V_1$.

In order to act as a diode, the first connection 435 of the field effect transistor 436 is connected to the control connection 438 of the field effect transistor 436. The current/voltage conversion achieved by a field effect transistor 436 connected in such a way that may also be achieved by means of a transistor connected as an active load. A further embodiment could be achieved by using a suitable resistor. What can be achieved with such current/voltage conversion is that a small change in the current intensity results in the largest possible change in the voltage.

The second connection 429 and 430 respectively of the respective first switch 424 and 426 in the two paths 330 and 340, respectively, is connected to a first connection 439 and 440 respectively of a capacitor 441 and 442, respectively, the second connection 443 and 444, respectively, of which may be connected, for example to the reference-ground potential or some other first potential $V_1$.

The switching elements 423, 424, 425 and 426 can be controlled by the control unit 370 and are embodied, e.g., as a transmission gate component or, e.g., as a transfer gate component. Other embodiments of the switching element may also be used in alternative configurations of the invention.

Figure 6:
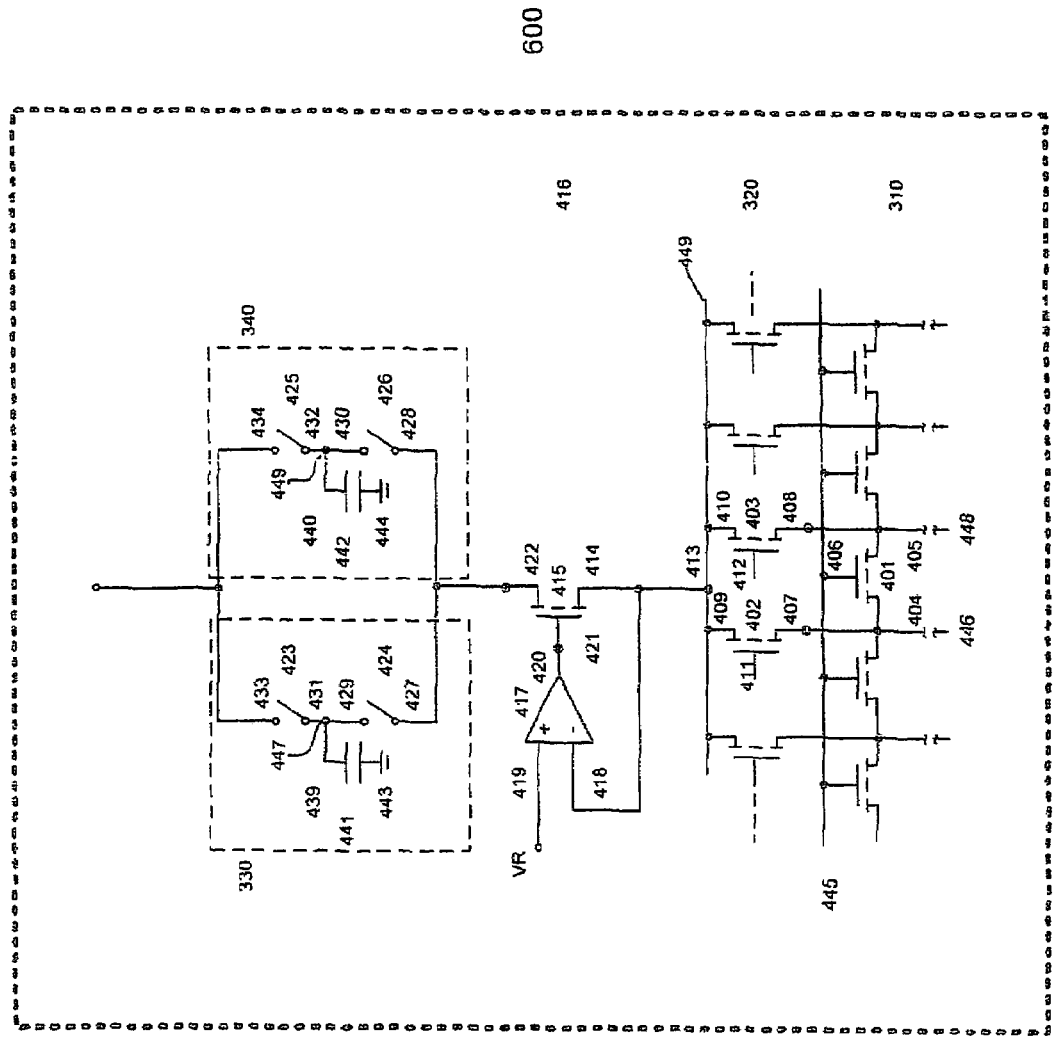
FIG. 6 shows an electrical circuit arrangement with drain-side sensing according to a second exemplary embodiment of the invention.

An electronic drain-side sensing measuring circuit arrangement 600 in accordance with a second exemplary embodiment of the invention is illustrated in FIG. 6 and essentially corresponds to the electronic drain-side sensing measuring circuit arrangement 300 illustrated in FIG. 4 with the following differences:

The current/voltage converter 380 of FIG. 4, with the FET 436 connected as a diode and the connections 435, 382 and 438, has been omitted. In the drain-side sensing measuring circuit arrangement 600 in accordance with this exemplary embodiment, the second potential $V_2$ or the supply voltage $V_{CC}$ may be directly connected to the interconnected second connections 433 and 434 of the second switches 423 and 425. The modified driving of this modified measuring circuit arrangement 600 by comparison with the embodiment illustrated in FIG. 4 is explained below after the description of the driving of the drain-side sensing measuring circuit arrangement in accordance with the first exemplary embodiment of the electronic circuit arrangement 300.

Figure 8:
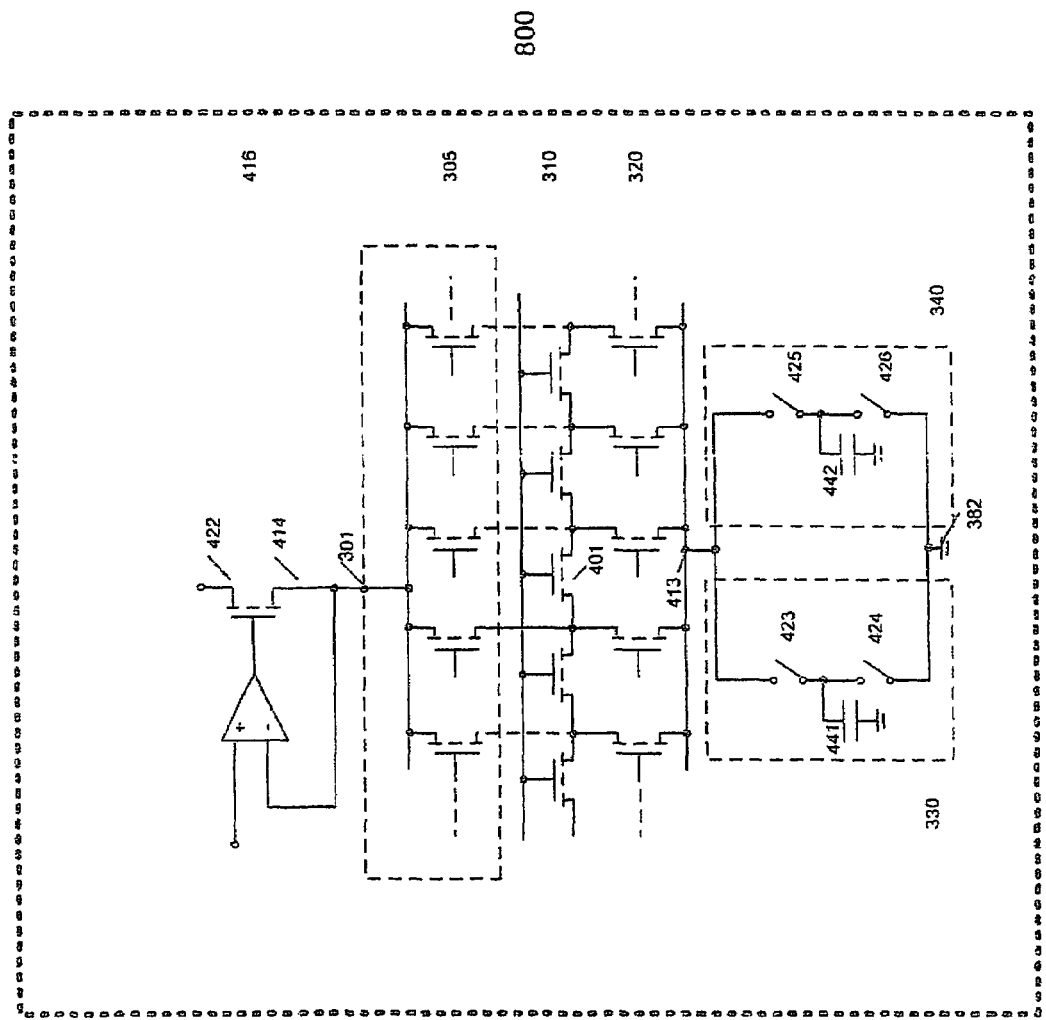
FIG. 8 shows an electrical circuit arrangement with source-side sensing in accordance with a third exemplary embodiment of the invention.

A source-side sensing measuring circuit arrangement 800 in FIG. 8 in accordance with a third exemplary embodiment corresponds to the drain-side sensing measuring circuit arrangement 600 in accordance with the exemplary embodiment illustrated in FIG. 6 with the following differences:

The output node 413 of the second decoder 320 is directly connected to the two partial circuit paths 330 and 340. In this exemplary embodiment, the second connection 382 of the series circuit is at low potential, typically ground potential. The potentiostat circuit 416 is connected by the first connection 414 to the second connection 301 of the first decoder 305, whereby it is possible to set the operating conditions of the memory elements 401 for reliable detection of the charge state of the memory element 401. The second connection 422 of the potentiostat circuit 416 is connected to the higher potential $V_2$.

By means of corresponding driving—described later—of this source-side sensing measuring circuit arrangement 800 by means of the control unit 370, it is possible, in this exemplary embodiment of the circuit, too, for the charge state, e.g., of the memory element 401 to be read out, stored and provided for further electrical processing.

An explanation is given below, by way of example, of the driving of the electronic drain-side sensing measuring circuit arrangement 300 according to the first exemplary embodiment illustrated in FIG. 4, with the memory elements 401 being operated in at least two operating modes for reading out and providing the electrical quantities in a manner referred to as voltage integration IV (integration voltage).

In a first operating mode 501 (cf. diagram 500 in FIG. 5) of the driving, the memory element 401 is switched by means of the application of a suitable voltage by means of the control unit 370 to a memory element selection connection 445 via the control gate 406 and a suitable voltage to the first source/drain connection 404 for the first operating mode of the memory element 401 such that, depending on the storage state of the memory element 401, a corresponding current can flow from a first connection 446, at which a first potential $V_1$ is present, through the first source/drain connection 404 to the second source/drain connection 405. By means of a suitable driving of the control gate 412 of the selection transistor 403 of the second decoder circuit 320 by means of the control unit 370, the memory element 401 to be detected is connected via the selection transistor 403 to the output node 413 of the second decoder circuit 320.

The output node 413 of the second decoder circuit 320 is driven by means of the potentiostat circuit 416 such that, by control of the current through regulating FET 415, it holds the node 413 at a constant potential $V_R$ corresponding to the reference voltage $V_R$. The operating conditions of the memory elements 401 for reliable detection of the charge state of the memory element 401 are thereby set.

The switches 423 and 424 in the first path 330 are both switched to be conducting "H" (see switching profile 502 of the first switch 424 of the first path 330 and switching profile 503 of the second switch 423 of the first path 330 in FIG. 5) and the switches 426 and 425 in the second path 340 are both switched to the non-conducting "L" (see switching profile 504 of the first switch 426 of the second path 340 and switching profile 505 of the second switch 425 of the second path 340 in FIG. 5). As a result, the voltage $V_{F1}$ is established at the node 447 according to the current in the first path 330 by means of the current-voltage converter 380, which is embodied here as FET 436 connected as a diode, which voltage is stored by the partial storage unit 441, which is embodied as a capacitor 441 here, within the first phase 501. The RC element is advantageously dimensioned such that the product of resistance and capacitance is less than the time duration of the phase 501 in order that the instantaneous voltage data is stored.

After the first operating mode of the memory element 401 the switches 423 and 424 are switched to be non-conducting "L" in a second operating mode 506 in order to obtain the electrical state of the partial storage unit 441.

In the second operating mode 506 of the driving, the memory element 401, after the application of a suitable voltage by means of the control unit 370 to the memory element selection connection 445 via the control gate 406 and a suitable voltage to a second connection 448 and thus to the second source/drain connection 405 for the second operating mode of the memory element 401, is switched such that, depending on the storage state of the memory element 401, a corresponding current can flow from the second connection 448, at which a first potential $V_1$ is present, through the second source/drain connection 405 to the first source/drain connection 404. By means of a suitable driving of the control gate 411 of the selection transistor 402 of the second decoder circuit 320 by means of the control unit 370, the memory element 401 to be detected is connected via the selection transistor 402 to the output node 413 of the second decoder circuit 320.

Once again, the output node 413 of the second decoder circuit 320 is driven by means of the potentiostat circuit 416 such that, by control of the current through regulating FET 415, it holds the output node 413 at a constant potential $V_R$ corresponding to the reference voltage $V_R$. The operating conditions of the memory elements 401 for reliable detection of the charge state of the memory element 401 are thereby set.

The switching elements 423 and 424 in the first path 330 are both switched to be non-conducting "L" and the switches 425 and 426 in the second path 340 are both switched to be conducting "H". As a result, a voltage $V_{F2}$ is established at the node 449 according to the current in the second path 340 by means of the current-voltage converter 380, which is embodied here as a FET 436 connected as a diode, which voltage is stored by the partial storage unit 442, which is embodied here as a capacitor 442.

After this second operating mode 506, of the memory element 401, the switches 425 and 426 are both switched to be non-conducting "L" by the control unit 370 in order to obtain the electrical state of the partial storage unit 442. The two partial storage units 441 and 442 have now assumed electrical states that correlate with the charge state of the memory element 401 and provide the electrical states for further data processing.

Figure 10:
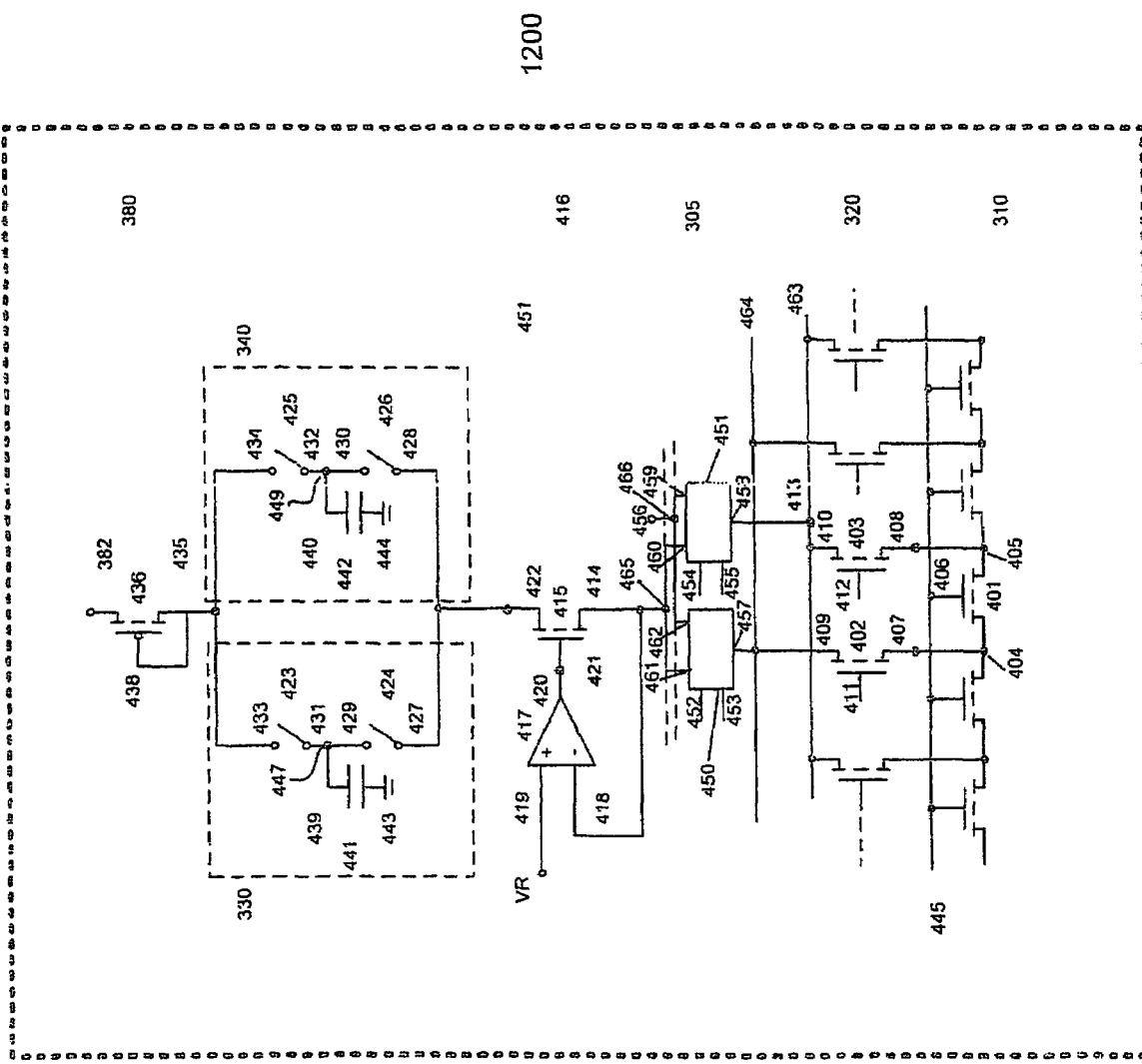
FIG. 10 shows an electrical circuit arrangement with drain-side sensing in accordance with a fourth exemplary embodiment of the invention.

FIG. 10 shows a measuring circuit arrangement 1200 as a fourth exemplary embodiment in a modification of the measuring circuit arrangement 600.

In the case of the measuring circuit arrangement 1200, in modification of the measuring circuit arrangement 300 of FIG. 3, the second connection 301 of the first decoder 305 of the measuring circuit arrangement 1200 is connected to the second connection 322 of the second decoder 320 of the measuring circuit arrangement 1200 such that the circuit can be constructed with fewer selection transistors by comparison with the measuring circuit arrangement 300.

Figure 11:
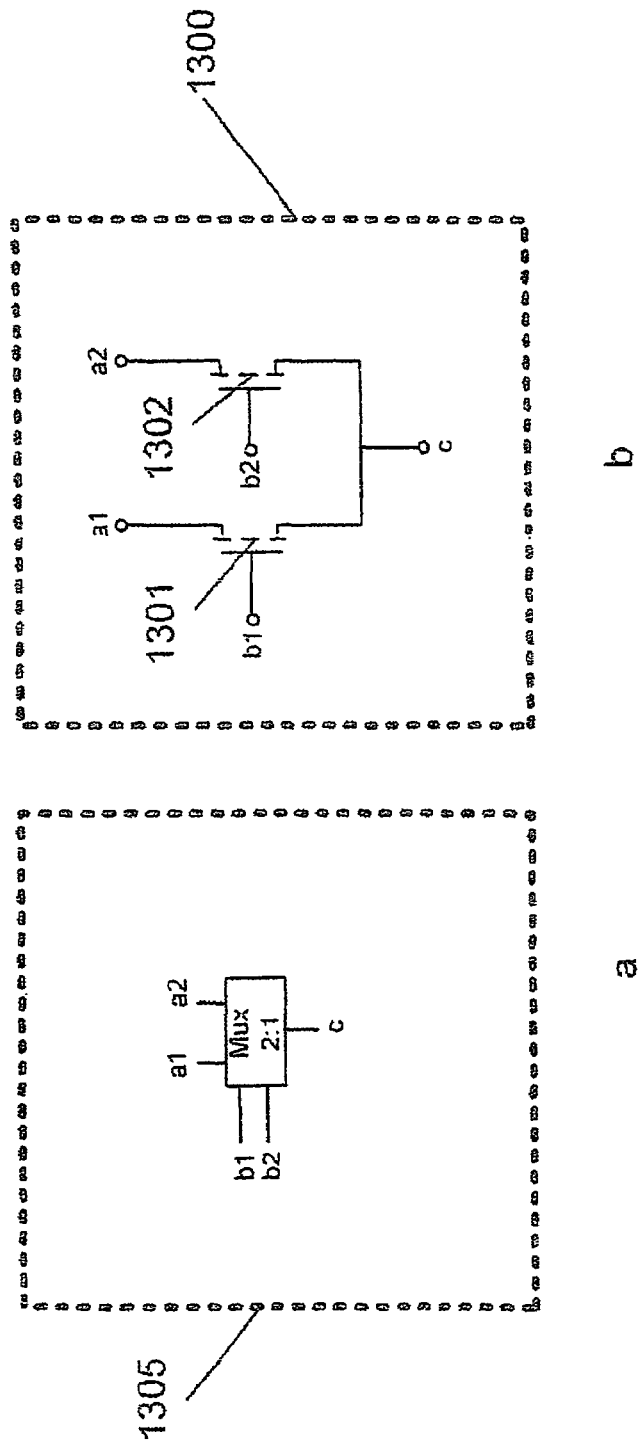
FIG. 11 shows an embodiment of a circuit block of an electrical circuit arrangement with drain-side sensing.

The first decoder 305 of the measuring circuit arrangement 1200 shows at least two multiplexer circuits 450 and 451. One embodiment of the multiplexer circuits 450 and 451 with two FET transistors 1301 and 1302 is shown in FIG. 11b. The block diagram 1305 of the multiplexer circuit 1300 of FIG. 11a has an input c, a first output a1 and a second output a2 and a first control connection b1 and a second control connection b2.

The embodiment of the multiplexer circuit 1300 according to FIG. 11b shows a first FET 1301 and a second FET 1302. The first connection of the first FET 1301 and the first connection of the second FET 1302 are connected to the input c of the multiplexer circuit. The second connection of the first FET 1301 is connected to the first output a1 of the multiplexer circuit. The second connection of the second FET 1302 is connected to the second output a2. The third connection of the first FET 1301 is connected to the first control connection b1 of the multiplexer circuit and the third connection of the second FET 1302 is connected to the second control connection b2 of the multiplexer circuit.

In the exemplary embodiment of the measuring circuit arrangement 1200 the second decoder circuit 320 shows a first selection transistor such as, e.g., 402 and a second selection transistor such as, e.g., 403 for each memory element such as, e.g., 401.

In the measuring circuit arrangement 1200, the second connection such as e.g. 409 of the respective first selection transistor such as, e.g., 402 of the second decoder circuit 320 is in each case respectively connected to one another, e.g., by means of a connection line 464. The respective second connections such as, e.g., 410 of the second selection transistors such as, e.g., 403 are in each case connected to one another, e.g., by means of a connection line 463.

The input 457 of the first multiplexer circuit such as, e.g., 450 is connected e.g. by means of the connection line 464 in each case to the second connections such as, e.g., 409 of the first selection transistors such as, e.g., 402. The input 458 of the second multiplexer circuit such as, e.g., 451 is connected, e.g., by means of the connection line 463 in each case to the second connections such as, e.g., 410 of the second selection transistors such as, e.g., 403.

The first outputs of the multiplexer circuits such as, e.g., 461 of the first multiplexer circuit 450 are in each case connected to the first outputs such as, e.g., 460 of the multiplexer circuits such as, e.g., of the second multiplexer circuit 451 and the node 465. The second outputs of the multiplexer circuits such as, e.g., 462 of the first multiplexer circuit 450 are in each case connected to the second outputs such as, e.g., 459 of the multiplexer circuits such as, e.g., of the second multiplexer circuit 451 and to the node 466.

The node 465 is connected to the first connection 414 of the regulating FET 415 and is thus at the reference potential.

The node 466 may be connected to a low potential by means of the connection 456.

The first and second control connections such as, e.g., 452 and 453, 454 and 455, of the respective multiplexer circuits such as, e.g., 450 and 451 are connected to the control unit 370.

An explanation is given below, by way of example, of the operation of the modified measuring circuit arrangement 1200 according to the exemplary embodiment illustrated in FIG. 10, with the memory elements 401 being operated in at least two operating modes for reading out and providing the electrical quantities in a manner referred to as voltage integration IV (integration voltage).

In a first operating mode 501 (cf. diagram 500 in FIG. 5) of the driving, the memory element 401 is switched by means of the application of a suitable voltage by means of the control unit 370 to a memory element selection connection 445 via the control gate 406 and a suitable voltage to the first source/drain connection 404 for the first operating mode of the memory element 401 such that, depending on the storage state of the memory element 401, a corresponding current can flow through the memory element 401.

This current through the memory element 401 is driven by the potential difference between the connection 456 at low potential and the node 465 at higher reference potential. In the first operating mode 501, the current flows from the connection 456, through the second output 462 of the first multiplexer circuit 450, through the input 457 of the first multiplexer circuit 450, through the first selection transistor 402 of the second decoder circuit 320, through the memory element 401, through the second selection element 403 of the second decoder circuit 320, through the second multiplexer circuit 451 to the node 465. In this case, the control unit 370 controls both the third connections 411 and 412 of the selection transistors 402 and 403 of the second decoder circuit 320 and the first control connections 452 and 454 and the second control connections 453 and 455 of the first and second multiplexer circuits 450 and 451 synchronously with the driving of the memory cell 401.

In the second operating mode 506 of the memory cell 401, the current flow takes place through the elements described above as in the first operating mode 501 correspondingly in the opposite direction.

Figure 7:
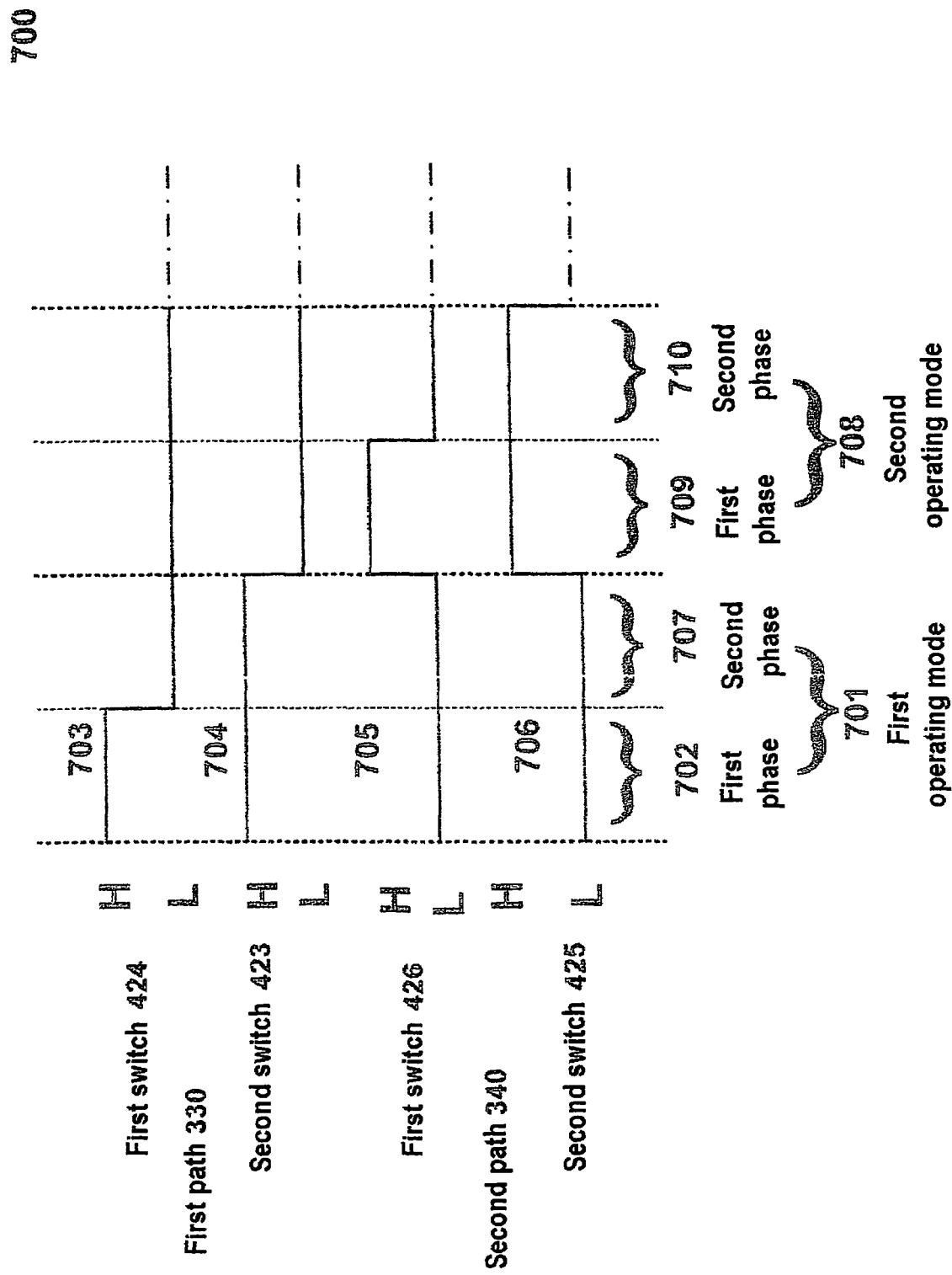
FIG. 7 shows a drive sequence of the electrical circuit arrangement with drain-side sensing in accordance with a second exemplary embodiment of the invention.

FIG. 7 shows, in a diagram 700, the modified driving of a drain-side sensing arrangement 600 in accordance with the second embodiment, by means of the control unit 370 according to FIG. 6, which can correspondingly also be applied to the operation of the arrangement 1200 of FIG. 10.

If, in the first operating mode 701 of the memory element 401, in the first phase 702, both the switching element 424 and the switching element 423 are switched to be conducting "H" (see switching profile 703 of the first switch 424 of the first path 330 and the switching profile 704 of the second switch 423 of the first path 330 in FIG. 7) and the switching elements 425, 426 are switched to be non-conducting "L" (see switching profile 705 of the first switch 426 of the second path 340 and the switching profile 706 of the second switch 425 of the second path 340 in FIG. 7), the partial storage unit 441 of the first partial circuit path 330 can be charged to the second potential $V_2$.

After the first switching element 424 has been switched to be non-conducting "L" in a second phase 707 of the first operating mode 701 of the memory element 401, the current of the selected memory element 401 will flow via the partial storage unit 441. In this case, a current flows in both operating states 702 and 707.

In the second phase 707, however, the current is fed from the capacitance and leads to a discharge of the capacitance and, consequently, after the end of the second phase 707, the capacitance will assume an electrical state that is characteristic of the charge state of the memory element 401. The electrical state is stored by means of the switching element 423 being switched to be non-conducting at the end of the second phase 707 in the first operating mode 701. FIG. 7 also shows the corresponding symmetrical driving of the switching elements 425 and 426 in a first phase 709 and a second phase 710 of a second operating mode 708 of the memory element 401 in order to pass an electrical quantity of the charge state of the memory element 401 into the second partial circuit path 340 and to store it in the partial storage unit 442.

Figure 9:
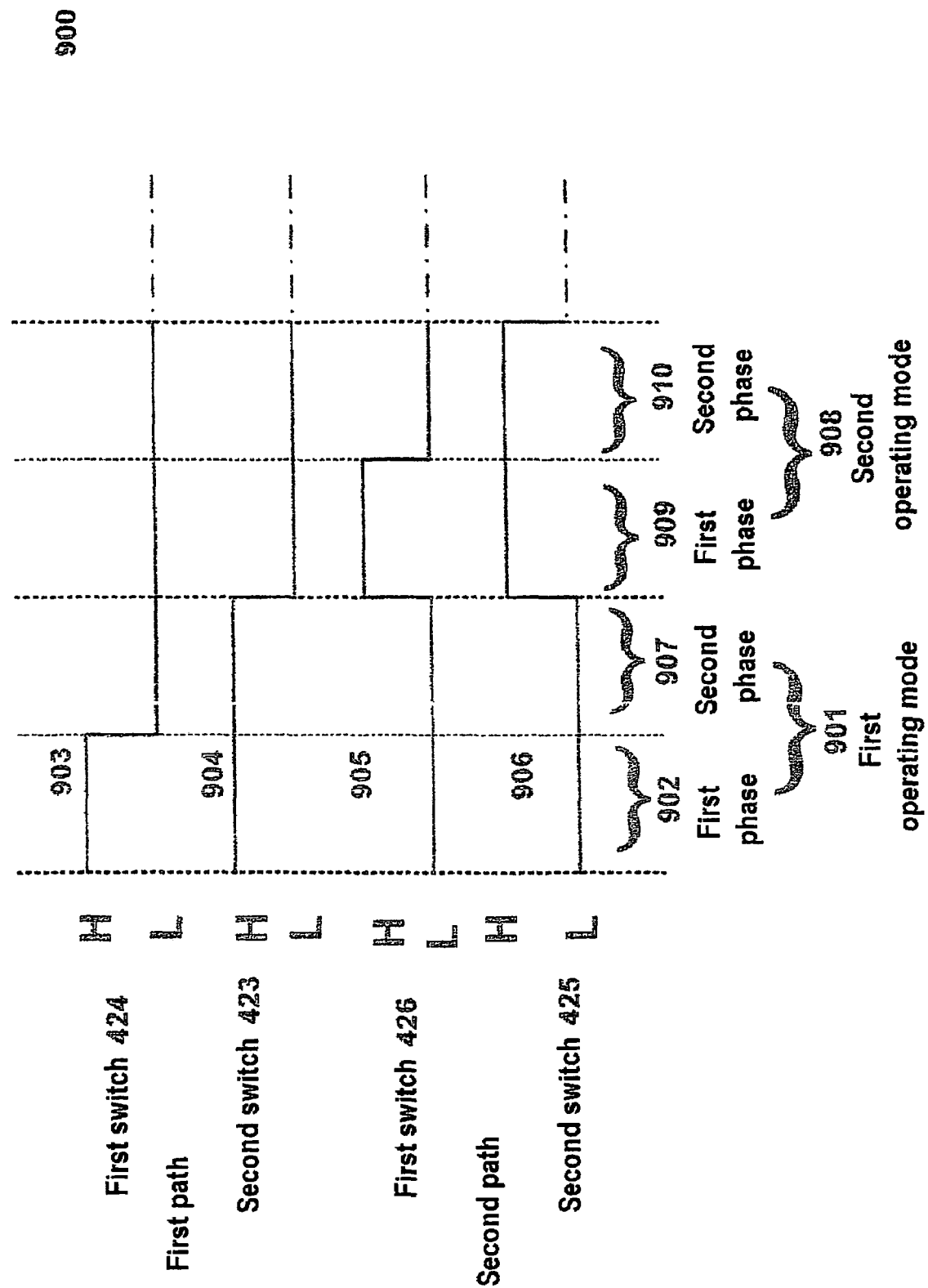
FIG. 9 shows a drive sequence of the electrical circuit arrangement with drain-side sensing in accordance with a third exemplary embodiment of the invention.

FIG. 9 shows, in a diagram 900 the driving of the electronic measuring circuit arrangement 800 with source-side sensing according to FIG. 8. In the first operating mode 901, e.g., of the memory element 401, in the first phase 902 of the driving by means of the control unit 370, the current flow of the memory element 401 is set and the switching elements 423 and 424 of the first partial circuit path 330 are switched to be conducting (see switching profile 903 of the first switch 424 of the first path 330 and the switching profile 904 of the second switch 423 of the first path 330 in FIG. 9) and the switching elements 425 and 426 of the second partial circuit path 340 are switched to non-conducting (see switching profile 905 of the first switch 426 of the second path 340 and the switching profile 906 of the second switch 425 of the second path 340 in FIG. 9).

In a second phase 907 of the first operating mode 901 of the memory element 401, by means of the switching element 424 being switched to be non-conducting, the source-side current, e.g., of the memory element 401 is fed via the first partial circuit path 330 to the partial storage unit 441. By means of the current flow through the partial storage unit 441 and according to the length of the second phase 907, the electrical quantity that is characteristic of the electrical state, e.g., of the memory element 401 is set in the partial storage unit 441. After the switching element 423 has been switched to be non-conducting by the control unit 370 at the end of the second phase 907 of the first operating mode 901, e.g., of the memory element 401, the electrical state of the partial storage unit 441 is maintained for further electrical processing.

The driving scheme 900 of the FIG. 9 also shows how the driving in the first phase 909 and in the second phase 910 of the second operating mode 908, e.g., of the memory element 401 can be effected correspondingly symmetrically in order to provide the electrical quantity resulting from the charge state, e.g., of the memory element 401 for further processing.

In order to simplify the description, the driving schemes, that is to say the profiles of the switch positions, in FIGS. 5, 7 and 9 are illustrated such that alterations of the switching positions of the various switches proceed instantaneously and in a manner perfectly synchronized among one another. However, the circuit according to the invention may equally well be operated with ramped profiles of the alteration of the conductivity of the individual switches. Moreover, unlike what is illustrated by way of example, synchronization of the switching positions of different switches need not be effected instantaneously, rather it may lie within a time window which may result from requirements made by the circuit.

What is claimed is:

1. An electronic circuit arrangement, comprising:
   at least one memory element in which at least two electrical quantities can be stored, wherein the at least one memory element is a non-volatile memory cell and wherein the at least one memory element is a SONOS cell that can be operated in two different directions;
   a switching unit electrically coupled to the at least one memory element, the switching unit having at least one first circuit path and a second circuit path; and
   at least one storage unit having a first partial storage unit and at least one second partial storage unit, each partial storage unit for storing at least one electrical quantity;
   wherein the switching unit is set up in such a way that it can sequentially pass a first one of the at least two electrical quantities along the at least one first circuit path to the first partial storage unit and a second one of the at least two electrical quantities along the second circuit path to the second partial storage unit.

2. An electronic circuit arrangement, comprising:
   at least one memory element in which at least two electrical quantities can be stored;
   a switching unit electrically coupled to the at least one memory element, the switching unit having at least one first circuit path and a second circuit path; and
   at least one storage unit having a first partial storage unit and at least one second partial storage unit, each partial storage unit for storing at least one electrical quantity;
   wherein the switching unit is set up in such a way that it can sequentially pass a first one of the at least two electrical quantities along the at least one first circuit path to the first partial storage unit and a second one of the at least two electrical quantities along the second circuit path to the second partial storage unit; and
   wherein the at least one electrical quantity is stored in the at least one partial storage unit by means of at least one capacitor.

3. An electronic circuit arrangement, comprising:
   at least one memory element in which at least two electrical quantities can be stored;

a switching unit electrically coupled to the at least one memory element, the switching unit having at least one first circuit path and a second circuit path; and at least one storage unit having a first partial storage unit and at least one second partial storage unit, each partial storage unit for storing at least one electrical quantity;

wherein the switching unit is set up in such a way that it can sequentially pass a first one of the at least two electrical quantities along the at least one first circuit path to the first partial storage unit and a second one of the at least two electrical quantities along the second circuit path to the second partial storage unit; and wherein the switching unit includes:
  at least one selection element that can feed the at least one electrical quantity, according to a switching state of the at least one selection element, to the at least one partial storage unit; and
  at least one control unit that can predefine the switching state of the at least one selection element.

4. An electronic circuit arrangement according to claim 3, wherein the at least one memory element is a non-volatile memory cell.

5. The electronic circuit arrangement according to claim 3, wherein the at least one selection element has at least one transmission gate.

6. The electronic circuit arrangement according to claim 3, further comprising a control unit set up in such a way that the at least one selection element can first couple a first one of the at least two electrical quantities of the at least one memory element to the first partial storage unit and can then couple a second one of the at least two electrical quantities to the second partial storage unit.

7. The electronic circuit arrangement according to claim 6, wherein the control unit is set up in such a way that first a first electrical quantity can be provided by means of operating a memory element in a first manner and then the second electrical quantity can be provided by means of operating a memory element in a second manner.

8. The electronic circuit arrangement according to claim 7, wherein the at least one memory element is set up in such a way that the electrical quantities that can be provided during the operation of memory elements represent different charge states.

9. An electronic circuit arrangement comprising:
  at least one non-volatile memory element in which at least two electrical quantities can be stored and can be provided by means of different operation of the memory element;
  at least one storage unit having a first partial storage unit and at least one second partial storage unit, each partial storage unit being set up for storing at least one electrical quantity;
  a switching unit electrically coupled to the memory element and having at least one first circuit path and a second circuit path, the switching unit being set up in such a way that it can sequentially pass a first one of the at least two electrical quantities along the at least one first circuit path to the first partial storage unit and a second one of the at least two electrical quantities along the second circuit path to the at least one second partial storage unit;
  a control unit set up in such a way that, in a first one of at least two phases, the first one of the at least two electrical quantities of the memory element can be fed to the first partial storage unit in a first one of at least two circuit paths and, in a second one of the at least two phases, the second one of the at least two electrical quantities can be fed to the at least one second partial storage unit in the second one of the at least two circuit paths.

10. A method for reading and storing at least two electrical quantities of at least one memory element, the method comprising:
  a first one of at least two operating modes of the at least one memory element, feeding a first one of the at least two electrical quantities via a selection element to a first one of at least two partial circuit paths and storing the first one of the at least two electrical quantities by means of a first one of at least two partial storage units; and
  in a second operating mode of the at least one memory element, feeding the second one of the at least two electrical quantities via a selection element to a second partial circuit path and storing the second one of the at least two electrical quantities by means of a second one of at least two partial storage units.

11. The method according to claim 10, wherein the at least one memory element is a non-volatile memory element.

12. The method according to claim 10, wherein the at least one memory element is a SONOS memory element.

13. The method according to claim 12, wherein:
  in the first one of the at least two operating modes, current flows from a first connection of the memory element to a second connection of the memory element; and
  in the second one of the at least two operating modes, current flows from the second connection of the memory element to the first connection of the memory element.

14. The method according to claim 12, wherein the at least one memory element is operated in such a way that, in the first operating mode, a voltage is applied with a magnitude such that primarily a first charge accumulation as seen in the current direction above a channel region of the at least one memory element has a main influence on a defined electrical quantity and, in the second operating mode, a second voltage is applied with a magnitude such that first and second charge accumulations over the channel region of the memory element exert a significant influence on a definition of the electrical quantity.

15. The method according to claim 12, wherein precisely one circuit path is assigned to each operating mode of the memory element.

16. The method according to claim 10, wherein storing the first one of the at least two electrical quantities comprises changing a state of the partial storage unit by charging a capacitor.

17. The method according to claim 10, wherein storing the first one of the at least two electrical quantities comprises changing a state of the partial storage unit by discharging a capacitor.

18. An electronic circuit arrangement comprising:
  storage means for storing at least two electrical quantities; and
  switching means electrically connected to the storage means, the switching means having a first circuit path, a second circuit path, a second storage means and a third storage means for storing in each case at least one electrical quantity,
  the switching means comprising a means for sequentially passing a first one of the at least two electrical quantities along the first circuit path to the second storage means and a second one of the at least two electrical quantities along the second circuit path to the third storage means.

19. A computer program product for reading and storing at least two electrical quantities of at least one non-volatile memory element, which, when it is executed by a processor, in a first one of at least two operating modes of the at least one memory element, feeds the first one of the at least two electrical quantities via a selection element to a first one of at least two partial circuit paths and stores it by means of a first one of at least two partial storage units, and, in a second operating mode of the at least one memory element, feeds the second one of the at least two electrical quantities via a selection element to a second partial circuit path and stores it by means of a second one of at least two partial storage units.

* * * * *